(12) United States Patent
Siefers et al.

(10) Patent No.: US 6,894,479 B2
(45) Date of Patent: May 17, 2005

(54) CONNECTOR CABLE AND METHOD FOR PROBING VACUUM-SEALABLE ELECTRONIC NODES OF AN ELECTRICAL TESTING DEVICE

(75) Inventors: John E. Siefers, Loveland, CO (US); Philip N. King, Fort Collings, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 95 days.

(21) Appl. No.: 10/228,026

(22) Filed: Aug. 26, 2002

(65) Prior Publication Data

US 2004/0036465 A1 Feb. 26, 2004

(51) Int. Cl.[7] .............................................. G01R 31/02
(52) U.S. Cl. ................................................... 324/158.1
(58) Field of Search ........................... 174/1, 2, 110 R, 174/135, 265; 361/683–686, 826; 324/754, 158.1

(56) References Cited

U.S. PATENT DOCUMENTS

| 65,019 A | * | 5/1867 | Simpson ................. 174/110 R |
| 4,771,234 A | | 9/1988 | Cook et al. ................. 324/754 |
| 6,378,378 B1 | * | 4/2002 | Fisher .......................... 73/754 |

* cited by examiner

*Primary Examiner*—David Zarneke
*Assistant Examiner*—Russell M. Kobert (57) ABSTRACT

A novel thin wire connector cable and method for connecting an electrical test instrument to an electrical node of interest sealable within a vacuum chamber of an electrical testing device is presented. The thin wire connector cable includes a thin wire cable with a first end connectable to the test instrument and a second end comprising a connector electrically connectable to the electrical node of interest that lies within the vacuum-sealable chamber. The thin wire cable is routed from the vacuum-sealable chamber to the test instrument in between a flexible vacuum seal and an opening to the vacuum-sealable chamber such that when the vacuum is actuated, the thin wire cable is wedged between the seal and testing device. The thin wire cable is substantially thin enough so as to prevent more than a negligible amount of leakage between the thin wire cable and the flexible vacuum seal, which allows a vacuum to be generated and maintained.

10 Claims, 5 Drawing Sheets

CONNECTOR CABLE AND METHOD FOR PROBING VACUUM-SEALABLE ELECTRONIC NODES OF AN ELECTRICAL TESTING DEVICE

FIELD OF THE INVENTION

The present invention pertains generally to testing of printed circuit boards, and more particularly to a technique for probing vacuum-sealed nodes of interest using external test instruments.

BACKGROUND OF THE INVENTION

Printed circuit assembly (PCA) test hardware is used to test PCAs after manufacture. Such testing may include electrical connectivity, voltage, resistance, capacitance, inductance, circuit function, device function, polarity, vector, vectorless, and circuit functional testing.

In order to perform the tests, the tester hardware must be capable of probing conductive pads, vias and traces on the board under test. Electronic signals are employed by the board test system to determine whether each electronic component on the PCA is operating properly. A test fixture provides a mechanical and an electrical interface between the board test system interface pins and the electronic components located on a PCA to be tested. Since signals must pass through the test fixture both on their way to and from the electronic component, the test fixture must not degrade the quality of these signals in order to ensure that the electronic component is correctly diagnosed as operating properly or improperly.

In order to ensure a high quality signal path to and from the test system, the probes must make a firm electrical and mechanical contact with the component. This is commonly achieved using vacuum-actuated test fixtures.

Prior art vacuum actuated test fixtures are typically constructed from two plates. The first plate, or probe plate, is a thick plate made from an insulator having holes corresponding to the locations of the electrical nodes/contacts of interest on the PCA under test. The probes are mounted in these holes. Typically the probes comprise a spring loaded probe and a probe socket. A second plate, or top plate, having holes corresponding to the locations of the probes, is mounted on alignment pins and held above the probe plate by preloaded fixture springs. A seal is then placed around the perimeter of the plates to form a vacuum chamber. When air is removed from the vacuum chamber, the top plate is drawn toward the probe plate causing each probes to pass through its corresponding hole in the top plate and strike electrical nodes/contacts of interest on the PCA under test. The PCA under test is positioned relative to the top plate by two or more tooling pins and held in place by the vacuum.

Single plate fixtures have also been developed. These fixtures comprise a probe plate which is almost identical to the probe plate of the two plate fixture. A thick layer of foam is placed directly on top of the probe plate. The foam is removed from the probe plate directly under the PCA except for the approximately one-half inch around the perimeter of the PCA which serves as the vacuum seal. Accordingly, the PCA itself operates as the top plate of the vacuum chamber.

In each embodiment of vacuum-actuated test fixtures, the fixture probes (i.e., the probes that make electrical contact with nodes on the PCA under test) lie within the vacuum chamber during test. Although the electrical signals theoretically pass from the fixture probe to its corresponding node on the PCA, and/or vice versa, such that one could measure the signal on the probe through the tester, occasionally it is desirable and useful to make measurements directly on the probe itself. For example, during debug of the PCA, one may desire to ensure that a signal generated by the tester is actually being delivered by the probe to the desired point of contact on the PCA. If not, this could indicate a fault in the tester. If so, it could indicate a fault on the PCA or insufficient contact force between the probe and probed PCA node. Conversely, it may be useful to determine whether a signal expected to be generated by the PCA is being received by a given probe. If not, it could indicate insufficient contact force between the probe and probed PCA node, or a fault on the PCA. If so, it could indicate a fault in the tester. Many other scenarios exist where it would be useful to allow an external instrument such as an oscilloscope, multimeter, or logic analyzer to connect to a probe within the vacuum-sealed chamber of the test fixture.

However, because the fixture probes and/or other electrical nodes of interest are sealed within the vacuum chamber of the fixture, connection to such probes/nodes by external electronic instruments is problematic due to probe access difficulties.

One method of probe access is to machine holes in the vacuum chamber enclosure (e.g., probe plate, PCA, vacuum chamber cover or vacuum seal). However, manufacturing vacuum enclosures with holes or apertures generally complicates the design and implementation of the vacuum fixturing and/or PCA due to the complexity in determining suitable locations for external instrument probe holes and the difficulty associated with maintaining a proper seal. Accordingly, this method is complicated, expensive, and time consuming.

Figure 1:
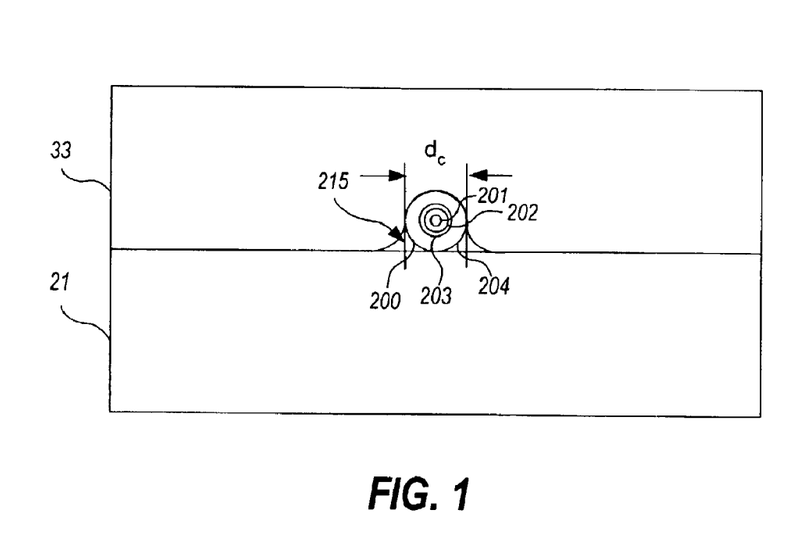
FIG. 1 is a cross-sectional side view of a vacuum-actuated test system illustrating an external instrument cable routed underneath the vacuum seal of the fixture.

Another method for achieving probe access by external instrument probes is to connect the external instrument probe to the desired fixture probe prior to actuation of the vacuum. The cable of the external instrument probe is then manually routed between the vacuum seal and appropriate fixture component (e.g., probe plate). Then, when the vacuum is actuated, the vacuum seal presses against the fixture with the external instrument probe cable wedged therebetween. This technique is advantageous over the above-described holing method in that the complexity and expense of designing and machining the holes is eliminated. However, the cable routing method is problematic in that the probe cable interferes with and prevents the creation of a true vacuum seal. FIG. 1, which shows a cross-sectional view of a test instrument cable 200 wedged between a vacuum seal 202 and fixture 204, illustrates the problem. As illustrated, the vacuum seal 33 presses against the probe plate of the fixture 21 over the external instrument cable, creating air gaps 215 on either side of the cable 200. The cross-sectional diameter $d_c$ of the probe cable, which is typically on the order of 0.125 inch, is large enough that the air gaps 205 allow sufficient leakage to prevent the creation of a true vacuum seal. This also risks damage to the probe cable, which is often quite expensive.

The current methods for probing a vacuum-sealed fixture probe and/or other nodes of interest sealed within the vacuum chamber are either very costly, or sacrifice vacuum-induced pressure on fixture-probe-to-PCA-node contacts due to air leakage through gaps created by external instrument cable routing. Accordingly, a need exists for an improved technique for allowing connection of test probes of external electronic instruments to electrical probes and/or other nodes of interest sealed within a vacuum chamber.

SUMMARY OF THE INVENTION

The present invention is a novel cable and method for connecting an external test instrument to an electrical probe and/or node of interest that is vacuum-sealable within a vacuum chamber of an electrical testing device. In the illustrative embodiment, the electrical testing device is a PCA tester with vacuum-actuated test fixture. During testing of a PCA by the PCA tester of this embodiment, a vacuum chamber is formed between the fixture cover and a test fixture probe plate in order to generate sufficient contact force between the test fixture probes and the test nodes of the device under test. The test fixture includes a flexible vacuum seal positioned between and around the peripheral edges of the fixture cover and test fixture probe plate. A vacuum chamber is formed within the space enclosed between the fixture cover, probe plate, and peripheral flexible vacuum seal. During test, a vacuum pumps air out of the chamber to vacuum-seal the edges of the flexible vacuum seal to the probe plate and fixture cover to form a vacuum.

In accordance with the invention, test instruments external to the vacuum chamber may electrically connect to nodes of interest that are vacuum-sealed within the vacuum chamber using a thin wire connector cable. In the preferred embodiment, the nodes of interest are test fixture probes that are inaccessible during test due to the vacuum seal. The thin wire connector cable includes a first end connectable to the test instrument probe and a second end electrically attached to an insulated connector. The insulated connector is connectable to one or more of the electrical probes and/or nodes of interest sealable within the vacuum chamber. The insulated connector includes an electrical contact which connects to the probe and/or node of interest and insulation which insulates the electrical contact to prevent electrical contact with any components other than vacuum-sealable electrical probe that it is connected to.

In operation, the insulated connector of the thin wire connector cable is connected to the vacuum-sealable electrical probe and/or node of interest prior to sealing the chamber. The thin wire cable is routed between the flexible vacuum seal prior and fixture prior to actuation of the vacuum pump. When the vacuum is actuated, the vacuum pumps all of the air out of the chamber to pull the device under test downward against the electrical probes of the fixture. The diameter of the cross-section of the thin wire is sufficiently small that any gaps formed between the vacuum seal and fixture due to the thin wire routed therebetween allows no more than a negligible amount of air flow between the thin wire and flexible vacuum seal. Accordingly, an external instrument may probe the electrical probe/node of interest within the vacuum chamber while a vacuum is generated and maintained within the chamber when the vacuum is actuated.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel cable and method for connecting an external test instrument to an electrical probe and/or node of interest that is vacuum-sealable within a vacuum chamber of an electrical testing device is described in detail hereinafter. Although the invention is described in terms of specific illustrative embodiments, it is to be understood that the embodiments described herein are by way of example only and that the scope of the invention is not intended to be limited thereby.

Figure 2:
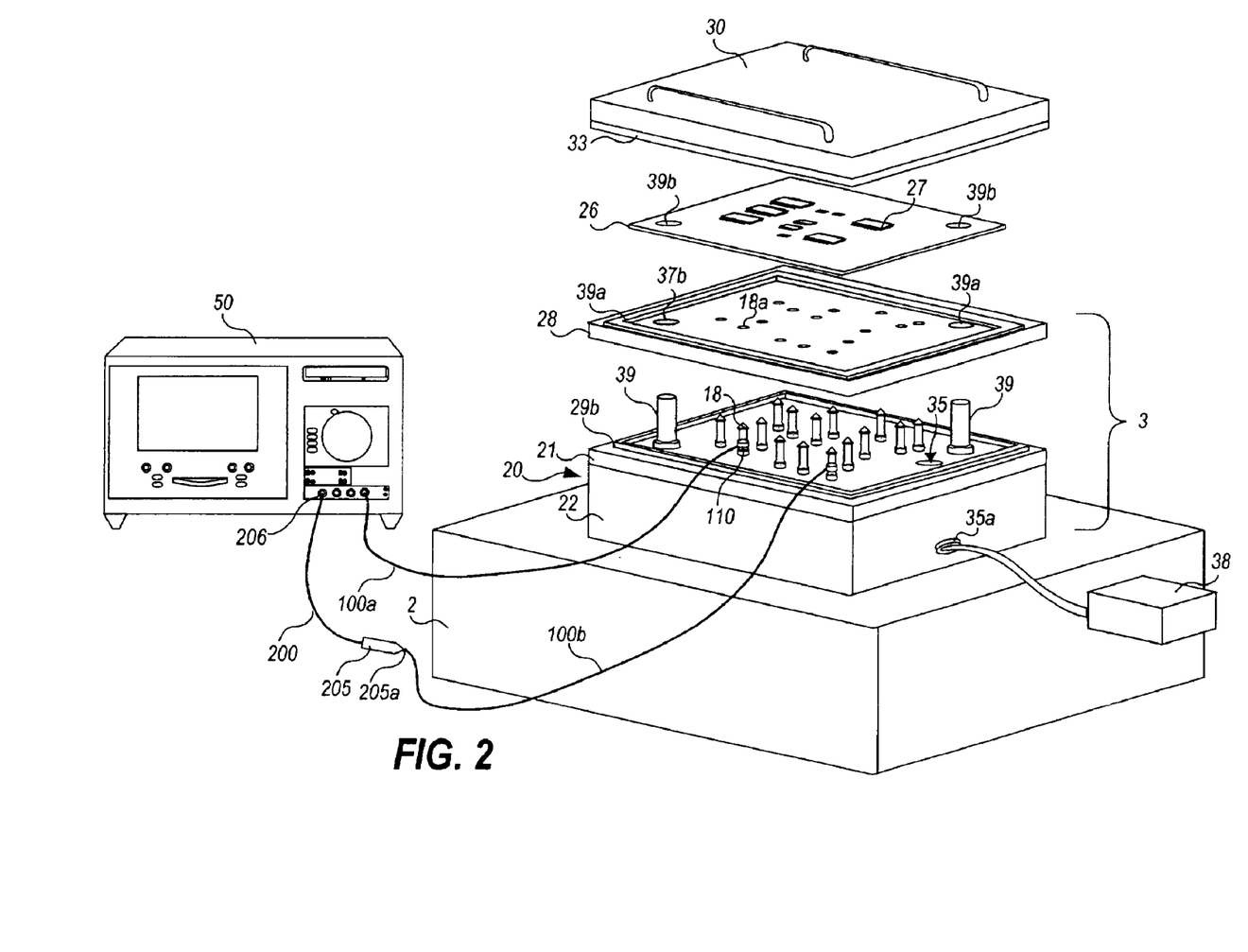
FIG. 2 is an exploded view of a first embodiment of a printed circuit assembly test system.

Turning now to the invention, FIG. 2 is an exploded view of a preferred embodiment of a vacuum-actuated printed circuit assembly (PCA) tester 2 with test fixture 3 mounted thereon and illustrating the connection of test instrument 50 to a fixture probe 18 using a first embodiment 100a and a second embodiment 100b of the thin wire connector cable 100 of the invention. As illustrated, vacuum-actuated fixture 3 includes a fixture frame 20, a support plate 28, and a cover 30. The fixture frame includes a probe plate 21 having a plurality of probes 18 which connect nodes on the underside of a PCA device under test (hereinafter "DUT") 26 to pins of the tester (not shown) when the fixture 3 is mounted on the tester 2. (Note that the size and spacing of the probes in FIG. 2 are exaggerated, and the number of probes reduced, in this view for clarity of illustration. In practice, the probes 18 are typically much higher in number and smaller in size and proximity.) A vacuum manifold 35 is formed within the fixture frame 20 and includes an external vacuum sealable connector 35a which is connectable to a vacuum pump 38.

The support plate 28 includes a plurality of probe guides 18a which are positioned to align with the locations of the probes 18, and alignment holes 39a which are positioned to align with the locations of tooling pins 39 attached to the probe plate 21. Tooling pins 39 assist in aligning the probes 18 with the probe guides 18a when the support plate 28 is positioned over the probe plate 21. A flexible vacuum seal 29b is attached to top side of the probe plate 21 and operates both as a support gasket when the support plate is mounted on the fixture 3 and as a vacuum seal when the vacuum is actuated.

The DUT 26 includes alignment holes 39b. A flexible vacuum seal 29a is attached to top side of the support plate 28. The flexible vacuum seal 29a operates as a support gasket when the DUT 26 is mounted on the support plate 28 (with the tooling pins 39 inserted through the alignment holes 39b of the DUT 26). The flexible vacuum seal 29a also operates as a vacuum seal when the vacuum is actuated.

The cover 30 includes a flexible vacuum seal 33 attached to the bottom peripheral edges of the cover 30. The seal 33 rests on the probe plate 21 when the fixture is assembled.

Figure 3:
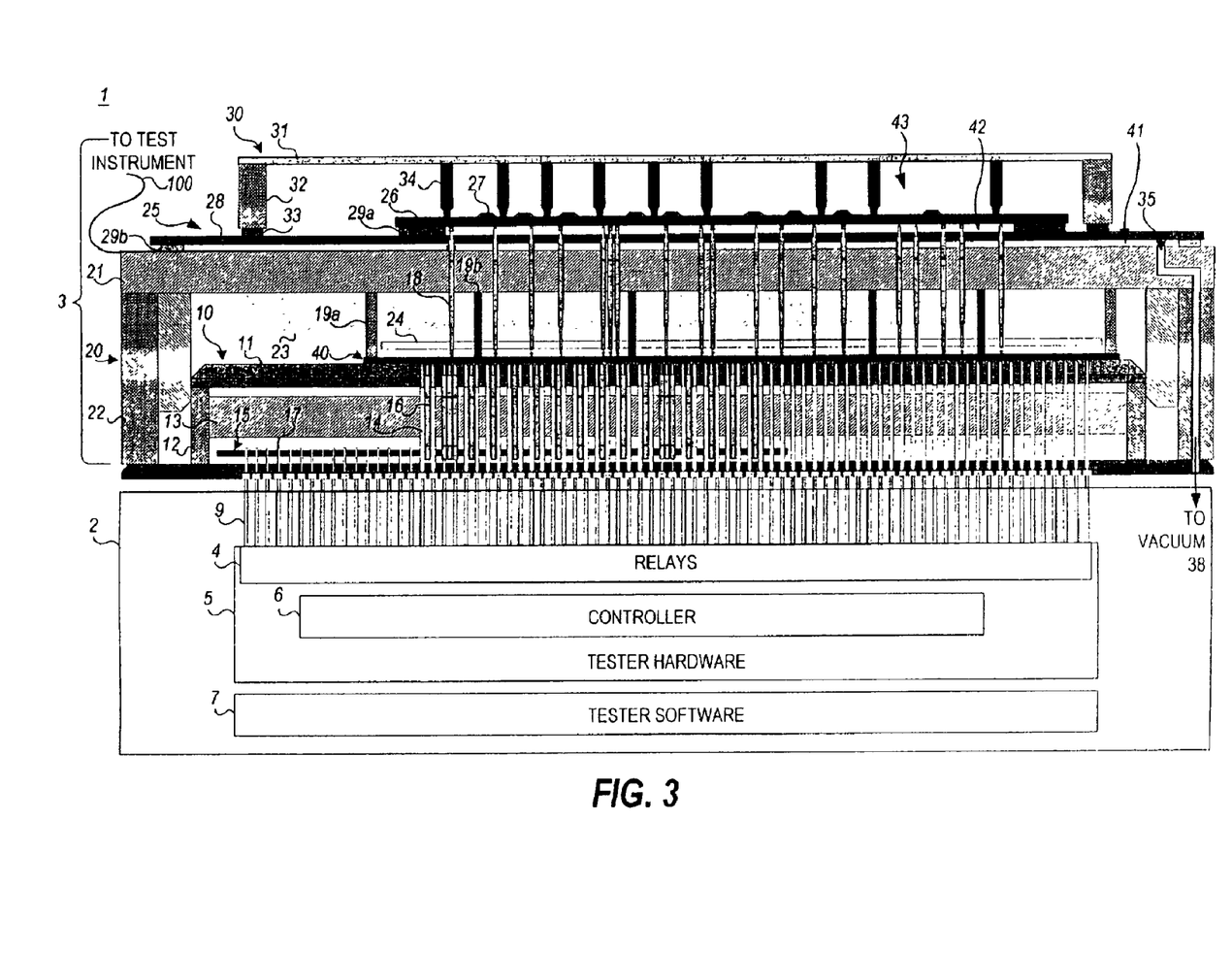
FIG. 3 is a cross-sectional view of a vacuum actuated test fixture (on a test system) with the vacuum actuated and illustrating an example of the connector cable routed under the vacuum seal of the fixture top cover and connecting to an external test instrument.

FIG. 3 shows a cross-sectional side view of a test system incorporating the vacuum-actuated test fixture 3 of FIG. 2 after actuation of the fixture 3. As illustrated, tester 2 includes a plurality of test interface pins 9 arranged in an array along the top side of the tester 2. Tester 2 includes tester hardware 5 which operates under the control of a controller 6. Controller 6 may be controlled by tester software 7, which may execute within the tester 2 itself, or remotely via a standard communication interface. One function of the controller 6 is to configure the hardware 5 to make or not make electrical connections between measurement circuits within the tester and each of the test interface pins 9. To this end, each test interface pin 9 is connectable to or isolated from the tester hardware by a relay 4. Electrical contact may be made with a respective test interface pin 9 by closing the relay; conversely, the pin 9 may be isolated from the test hardware by opening the relay 4.

Mounted on top of the tester and over the tester interface pin 9 field is the test adapter 10. The fixture PCB adapter 10 comprises an adapter top plate 11 and an adapter guide plate 13 which together are supported by sidewalls 12. Adapter 10 includes a plurality of solid floating probes 14 that are inserted through precisely aligned holes in the guide/plate 13 and top plate 11. Guide plate 13 ensures precise vertical alignment of solid floating probes 14.

In the embodiment shown, the adapter 10 also includes a probe field shrinking printed circuit board (PCB) 15 which is used to translate the relatively larger field of test interface pins 9 of the tester 2 to a relatively smaller probe field the size of the fixture PCB 40. In particular, in this embodiment, the probe field shrinking PCB 15 comprises a plurality of pins 17 that connect on one end to the top tips of certain test interface pins 9 of the tester and on the other end to conductive traces on the probe field shrinking PCB 15 which route to conductive pads on the top side of the probe field shrinking PCB 15. The adapter 10 includes a plurality of single-ended spring probes 16 whose bottom tips electrically contact the conductive pads on the top side of the probe field shrinking PCB 15. The single-ended spring probes 16 are also inserted through precisely aligned holes in the guide/plate 13 and top plate 11 which correspond to nodes of interest on the bottom side of the DUT 26 (when such DUT 26 is mounted thereon).

The fixture PCB adapter 10 is mounted over the test interface pin 9 field such that the bottom tips of the solid floating probes 14 and the bottom tips of the probe field shrinking PCB pins 17 align with and make electrical contact with the top tips of corresponding test interface pins 9 of the tester 2, as shown.

The wireless fixture 3 is formed with a frame 20, probe plate 21, and a fixture (wireless) printed circuit board (PCB) 40. The fixture PCB 40 is mounted with standoffs to the probe plate 21, which in turn is attached to the fixture frame 20 such that the top tips of the solid floating probes 14 and the top tips of the single-ended spring probes 16 align with and make electrical contact with conductive pads on the bottom side of the fixture PCB 40. The conductive pads on the bottom side of the fixture PCB 40 electrically connect to conductive pads on the top side of the fixture PCB 40 by way of traces and vias.

The fixture frame 20 includes a probe plate 21 and a reinforcement plate 23 supported by sidewalls 22, and a guide plate 24. Fixture frame 20 includes a plurality of double-ended spring probes 18 that are inserted through precisely aligned holes in the probe plate 21, reinforcement plate 23 and guide plate 24. Plastic spacers 19b and/or standoffs 19a prevent deflection and/or warping of the fixture PCB 40 due to imbalanced vertical forces when the assembly is vacuum compressed during test of a DUT 26.

Frame 20 is positioned over the fixture adapter 10, precisely aligning the bottom tips of the double-ended spring probes 18 onto conductive pads on the top of the fixture PCB 40 to ensure electrical contact.

The DUT mount 25 includes a support plate 28 mounted on the top side of the frame probe plate 21 by foam gaskets 29b. Foam gaskets 29a are also mounted on the top side of the support plate 28 to allow a DUT 26 such as a printed circuit board to be mounted thereon. The printed circuit board 26 may be loaded, including one or more electrical components 27 attached thereto, or may be a bare board.

A cover 30 comprising a top plate 31 and sidewalls 32 includes a flexible vacuum seal 33 attached to the bottom edge of the cover sidewalls 32. After a DUT 26 is precisely positioned and aligned on the DUT mount 25, the cover 30 is positioned on top of the support plate 28 so as to enclose the DUT 26. As known by those skilled in the art, when actuated, the vacuum-actuated fixture 3 may exert a compression force upwards of 1000 lbs (or approximately 10 lbs/square inch with a good vacuum). Accordingly, the cover is configured with pushrods 34 attached to the top plate 31 on the inside of the cover 30 which help keep bowing of the DUT PC board to a minimum. A vacuum manifold 35 is formed within the frame sidewalls 22 and connected to a vacuum 38 (FIG. 2).

When a DUT 26 is to be tested, the vacuum 38 is actuated, which pumps air from the vacuum chambers, causing the DUT 26 to be pulled vertically in the direction of the test fixture probes 18. When the fixture 3 is fully actuated, the tester interface pins 9 press on the fixture PCB 40 upward at its bottom conductive pads (indirectly through the probes 14, 16 of the fixture adapter 10). Simultaneously, the bottom tips of the double-ended probes 18 press against the fixture PCB 40 downward against its top conductive pads. The top tips of the double-ended probes 18 press against the bottom conductive pads of the DUT 26. During test of the DUT 26, the test software 7 directs the controller 6 to configure the tester hardware 5 to make connections between certain tester interface pins 9 of interest to measurement circuits within the tester hardware 5. The tester hardware 5 may then make measurements of the device or pad under test according to software instruction.

In the illustrative embodiment, as in FIG. 3, three vacuum chambers are formed when the fixture 3 is actuated. The first chamber 41 includes the space enclosed by the probe plate 21, support plate 28, and vacuum seal 29b. The second vacuum chamber 42 is formed in the area enclosed by the support plate 28, DUT 26, and seal 29a. The support plate has holes located according to the location of the electronic components on the PCA. Air passes through these holes, around the probe sockets and through the first vacuum chamber when the fixture is actuated. Air cannot pass into the first vacuum chamber from the bottom of the probe plate 21 because the base of the probe sockets 18a (FIG. 2) are expanded forming a press fit with the probe plate 21. The third vacuum chamber 43 includes the space enclosed by the inside of the cover 30, the support plate 28, and vacuum seal 33.

When the fixture is actuated, the fixture probes 18 extend through the socket holes in the probe plate 21 to contact nodes on the bottom side of the DUT 26. The support plate 28 is approximately five-eighths inch larger on each side than the DUT 26. The seal 33 of the preferred embodiment is approximately square in shape and three-eighths to one-half inch wide. The seal comprises an inner core and an outer shell. The inner core of the seal 33 comprises a foam strip, which is not impermeable to air flow. The foam material must be a low compression set and require low compression force to operate reliably.

The outer shell of the seal 33 comprises of a thin film surrounding the foam making the seal air tight. The outer shell must be flexible in order to prevent air leaks between the seal and the board and to reduce the force required to actuate the fixture. The outer shell may or may not be attached to the foam. In the preferred embodiment, the foam of the inner core is an open cell urethane and the thin film of the outer shell is a urethane membrane not attached to the core.

Figure 4A:
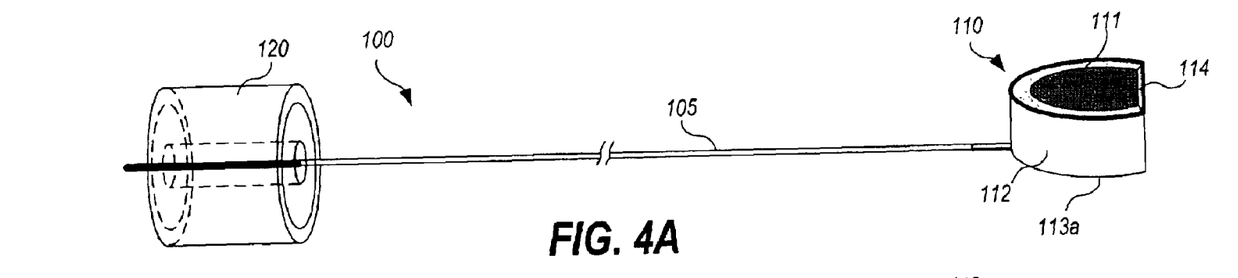
FIG. 4A is a perspective view of a first embodiment of a thin wire connector cable of the invention.
Figure 4B:
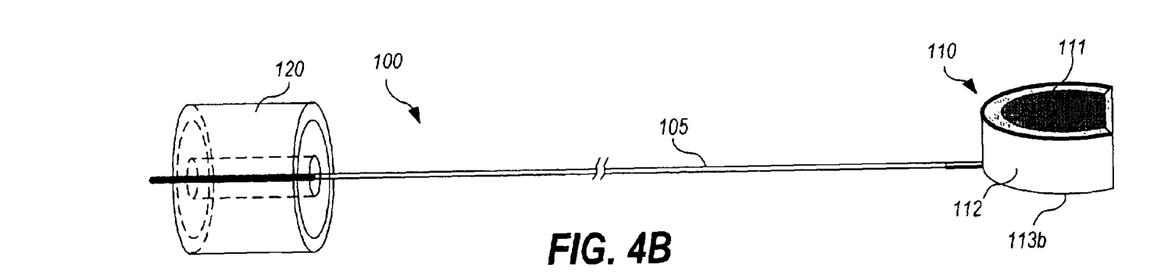
FIG. 4B is a perspective view of a second embodiment of a thin wire connector cable of the invention.

FIGS. 4A and 4B illustrate a first and second preferred embodiment of a thin wire connector cable 100 of the invention. As illustrated, the thin wire connector cable 100 comprises an insulated thin wire cable 105 connected at one end to an insulated fixture probe connector 110 and at the other end to a test instrument connector 120. The test instrument connector 120 may be configured to connect directly to the test instrument (as shown by 100a in FIG. 2) or may be configured to connect to a test instrument probe 200 which is connected to the test instrument 50 (as shown by 100b in FIG. 2). For example, if the test instrument 50 is an oscilloscope, a common test instrument probe connection is through a BNC connector. Accordingly, the test instrument connector 120 of the thin wire connector cable 100 of the invention may be implemented as a BNC connector to enable it to connect directly to the oscilloscope and eliminate connection with the test instrument probe altogether. Of course, if the test instrument connection is another type of connection suitable for connecting to high input impedance circuits, the test instrument connector 120 is implemented as the appropriate mating connector to enable electrical connection.

In an alternative configuration, the test instrument connector 120 connects to the probe tip 205a of a high-input-impedance test instrument probe 205 of a test instrument probe cable 200, which is in turn connected to the test instrument 50. For example, oscilloscope probes commonly present an impedance of about 1 Mohm resistance in parallel with about 10 pF. If the probe tip 205a of the test instrument probe 205 is a retractable spring-loaded hook clip, the test instrument connector 120 may be merely an uninsulated end of the wire 102, or may be implemented as a pin. Of course, the test instrument probe tip may be implemented in one of many possible forms (e.g., pin socket, banana clip, etc.), and it is contemplated that the test instrument connector 120 is implemented as the appropriate mating connector to enable electrical connection.

Figure 5A:
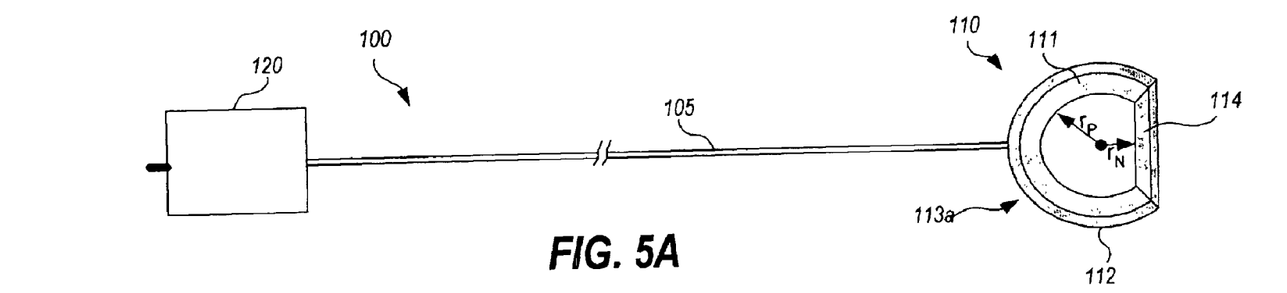
FIG. 5A is a top view of the first embodiment of the thin wire connector cable of the invention of FIG. 4A.
Figure 5B:
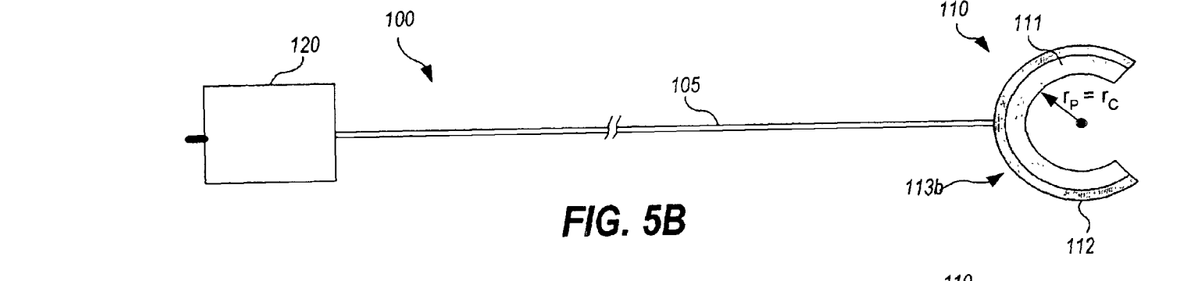
FIG. 5B is a top view of the second embodiment of the thin wire connector cable of the invention of FIG. 4B.
Figure 6A:
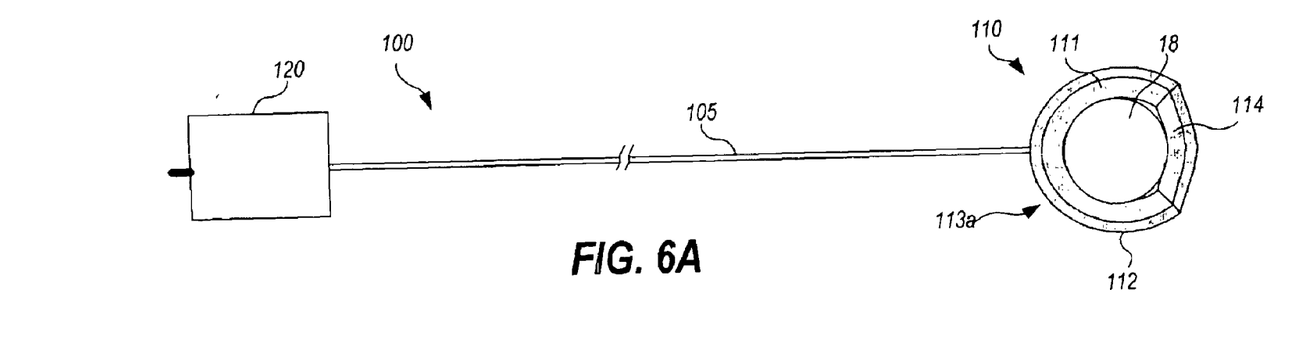
FIG. 6A is a top view of the first embodiment of the thin wire connector cable of the invention of FIGS. 4A and 5A illustrating connection to a probe.

The insulated connector 110 of the thin wire connector cable 100 of the invention includes an electrical contact 111. FIGS. 5A and 5B illustrate a top view of first and second preferred embodiments of the fixture probe connector 110 of the invention. In the preferred embodiment of FIG. 5A, the fixture probe connector 110 is implemented as a partial ring with spring force retainer. More particularly, the fixture probe connector 110 comprises an electrical contact 111 implemented as a partial ring 113a with retaining spring 114. In the preferred embodiment, the electrical contact portion 111 of the partial ring 113a is implemented using beryllium copper. A flat retaining spring 114 is attached across the open portion of the partial ring 113a. The characteristic spring constant of the retaining spring 114 is sufficient to allow the retaining spring to rebound to its original position once removed from a fixture probe to which it has been attached. In the preferred embodiment, the retaining spring 114 is implemented using beryllium copper. The radius $r_n$ of the center of the partial ring 113a to the nearest point of the retainer ring 114 is implemented to be smaller than the radius $r_p$ of the probes 18. Accordingly, when slipped over a fixture probe 18, as shown in FIG. 6A, the partial ring 113a is pressed snug against the probe 18 within the concave portion of the partial ring 113a by the force of the retainer spring 114.

Figure 6B:
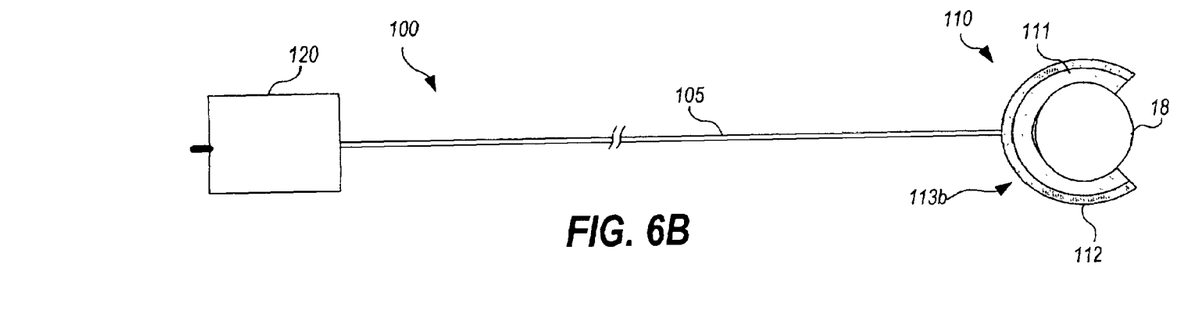
FIG. 6B is a top view of the first embodiment of the thin wire connector cable of the invention of FIGS. 4B and 5B illustrating connection to a probe.

In the preferred embodiment of FIG. 5B, the fixture probe connector 110 comprises an electrical contact 111 implemented as a partial C-ring 113b. In the preferred embodiment, the electrical contact portion 111 of the partial C-ring 113b is implemented using beryllium copper. The C-ring 113b is of sufficient circumference (at least of the same or smaller radius than, and greater than half the circumference of, the probe/pin it will connect to) that the partial ring 113b operates alone as a retaining spring. The radius $r_c$ of the center of the C-ring 113b is implemented to be less than or equal to than the radius $r_p$ of the probes 18. Accordingly, when slipped over a fixture probe 18, as shown in FIG. 6B, the C-ring 113b is pressed snug against the probe 18 by the force of the spring constant of the C-ring 113b. Accordingly, in this embodiment, the C-ring 113b is retained in connection with the probe/pin without the use of any additional retaining spring. The characteristic spring constant of the C-ring 113b is sufficient to allow the C-ring 113b to rebound to its original position once removed from a probe/pin to which it has been attached.

The electrical contact 111 is electrically connected to the thin wire cable 105 of the thin wire connector cable 100, thereby allowing a signal present on the probe 18 to be passed along the thin wire cable 105 to the test instrument connector 120, and consequently to the external test instrument.

Preferably, the electrical contact 111 is insulated by an outer insulator 112. In the preferred embodiment, the insulator 112 covers the external portion of the C-ring 113b/partial ring 113a and retaining spring 114. The insulator prevents shorting of the connector 110 to adjacent probes or nearby electrical nodes.

In operation, the fixture probe connector 110 of the thin wire connector cable 100 is fitted over a fixture probe 18 of interest prior to closing and actuating the fixture 3 (See FIGS. 2, 3, 6A, 6B). The test instrument connector 120 is connected to the test instrument 50, as shown in FIG. 2. The support plate 28 is mounted over the probe plate 21 in a position of alignment. The DUT 26 is inserted into the DUT mount 25, and the fixture is closed by closing the cover 30. At this point, the thin wire cable 105 of the thin wire connector cable 100 is routed underneath the vacuum seal 29b, such that it is wedged between the probe plate 21 and the vacuum seal 29b of the support plate 28.

The vacuum pump 38 is then actuated such that a vacuum is formed within the three vacuum chambers discussed previously, and the DUT 26 is pulled into electrical contact with the fixture probes 18. The tester 2 may then be instructed to run tests on the DUT 26, and signals present on the probe 18 attached to the thin wire connector cable 100 of the invention may then be monitored by the external test instrument 50 via the thin wire connector cable 100.

Figure 7:
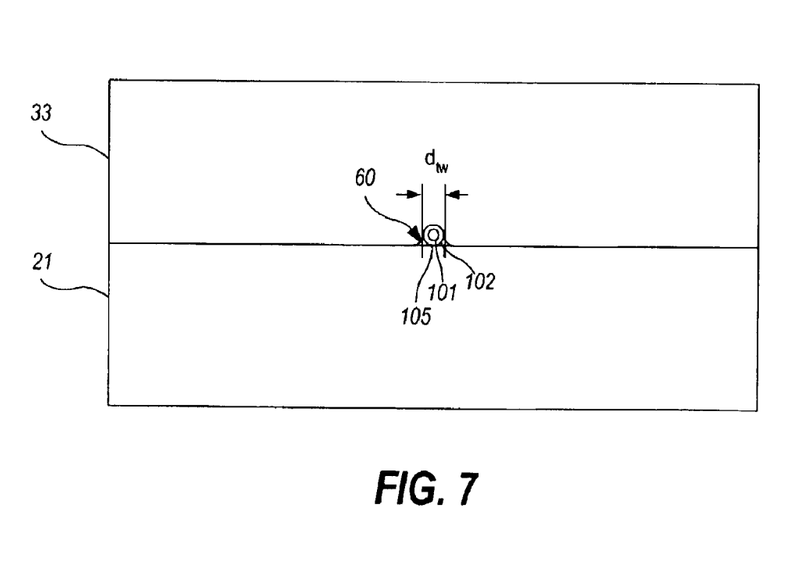
FIG. 7 is a cross-sectional side view of the fixture of FIG. 3 when a thin wire connector cable implemented in accordance with the invention is routed under a vacuum seal of the actuated fixture.

FIG. 7 is a cross-sectional side view of a portion of the fixture 3 of FIG. 3 when a thin wire connector cable 100 is routed under the vacuum seal 33 of the cover and the fixture 3 is actuated. As illustrated, the vacuum seal 33 presses against the probe plate over the thin wire cable 105 of the thin wire connector cable 100 of the invention. Because the diameter $d_{tw}$ of the thin wire is sufficiently small (i.e., $d_{tw} << d_c$), the wedge creates only very small air gaps 60 on either side of the thin wire 105 which result in negligible air leakage. In the preferred embodiment, the thin wire cable 105 is implemented with a 30-gauge wire 101 with outer insulation 102 having a cross-sectional diameter $d_{tw}$ (including the insulation) of 0.019 inches.

A typical prior art instrument probe uses coaxial cable 200 (see FIG. 1) whose characteristic impedance is determined by the ratio of inner to outer conductor diameter, and dielectric material properties. A coaxial cable 200 is formed by one physical channel 201 that carries the signal surrounded (after a layer of insulation 202) by another concentric physical channel 203, both running along the same axis. The outer channel 203 serves as a ground. The cable 200 may be placed in a single outer concentric sheathing 204, which is typically of large diameter to increase the physical strength of the cable to prevent damage.

An important feature of the present invention is that the thin wire cable 105 employs capacitive ground coupling which eliminates the need for a ground wire connection (and can therefore significantly reduce the cross-sectional diameter of the cable). In prior art probing techniques, a probe includes a ground lead connector which is connected to the measured circuit ground to provide a return signal path. However, the limitation for good vacuum sealing is the diameter of the cable.

The prior art vacuum sealing problem is solved through the use of the thin wire cable of the invention. In the preferred embodiment of the invention, the thin wire connector cable is used to probe AC signals and therefore eliminates the ground wire by using capacitive coupling to ground. In implementation, the thin wire cable 105 is an ordinary wire (of approximately 30 gauge). Accordingly, the capacitance between the outside of the coaxial cable and ground forms part of the measuring circuit. Capacitive coupling is not normally used for test instrument probes due to the RC decay factor. However, AC circuits used in PCA testing typically operate at a frequency high enough that the AC signal changes before the signal state on the cable has a chance to decay. In particular, the thin wire, capacitively coupled ground, and input impedance of the external probe/instrument form a band-pass network having an upper cut-off frequency of 100 MHz. This cut-off is acceptable because an in-circuit test does not operate at the rated speed of the DUT. For example, the Agilent 3070 PCA In-Circuit Tester of Agilent Technologies, Inc. of Palo Alto, Calif. offers 6, 12, and 20 MHz options for maximum speed In implementation, the capacitance to ground $C_g$ must be much greater than the input capacitance $C_i$ (i.e., $C_g >> C_i$). This allows coupling of AC signals, thereby providing a return path for the measurement signal. By utilizing an AC coupled ground path, this embodiment provides short settle times for high duty cycle load conditions, rather than requiring a plurality of high current ground paths between the load and the measuring circuit. In addition, an advantageous feature of AC ground coupling is that a relatively long cable can be used to connect to the DUT, without sacrificing loop stability or speed.

Of course, if DC measurements must be made, a separate thin wire ground wire must be provided.

In summary, the thin wire connector cable of the invention is advantageous over prior art probe cables by allowing the generation of a good vacuum seal through the use of an ordinary wire and capacitive ground coupling to eliminate the outer shield of the cable, which works under the low-frequency conditions imposed by the in-circuit test.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An apparatus, comprising:
a vacuum chamber which vacuum seals an electrical node of interest of a circuit under test using a flexible vacuum seal to seal one or more openings of said vacuum chamber;
a thin wire cable which probes an alternating current (AC) signal on said electrical node of interest, said thin wire cable comprising only a single wire and an insulation layer formed concentrically around said single wire, a first end having a test instrument connector that electrically connects to an external test instrument located outside of said vacuum chamber that is characterized by an external instrument input impedance and a second end having a node connector that electrically connects to said electrical node of interest sealed within said vacuum chamber, said thin wire cable being routed between said vacuum chamber and said external test instrument around or through said flexible vacuum seal, and said single wire and said insulation layer forming a capacitance to a ground on said circuit under test that is much greater than said external instrument input capacitance which allows detection of said AC signal by said external test instrument using only said thin wire cable.

2. An apparatus in accordance with claim 1, wherein:
said node connector comprises an external insulation layer.

3. An apparatus in accordance with claim 1, wherein:
said connector comprises a retainer which retains said connector in connection with said electrical node of interest.

4. An apparatus in accordance with claim 1, wherein:
said electrical node of interest is a probe of a test fixture which electrically contacts an electrical node of a printed circuit board.

5. An apparatus in accordance with claim 1, wherein:
said thin wire cable is approximately 0.019 inches in diameter.

6. An apparatus in accordance with claim 5, wherein:
said single wire of said thin wire cable is approximately 30 gauge.

7. An apparatus in accordance with claim 1, wherein:
said node of interest comprises an electrical probe; and
said connector comprises a loop which fits over said electrical probe.

8. An apparatus in accordance with claim 7, wherein:
said loop is configured in a cross-sectional shape that is substantially form fitting to a cross-sectional shape of said electrical probe.

9. An apparatus in accordance with claim 8, wherein:
cross-sectional shape of said electrical probe is circular; and
said cross-sectional shape of said loop comprises a partial ring.

10. An apparatus in accordance with claim 7, wherein:
loop comprises a retaining spring attached across an open end of said partial ring.

* * * * *